United States Patent
Knorr

(10) Patent No.: US 7,132,344 B1
(45) Date of Patent: Nov. 7, 2006

(54) SUPER SELF-ALIGNED BJT WITH BASE SHORTED FIELD PLATE AND METHOD OF FABRICATING

(75) Inventor: Christopher J. Knorr, Los Gatos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 70 days.

(21) Appl. No.: 11/003,690

(22) Filed: Dec. 3, 2004

(51) Int. Cl.
*H01L 21/331* (2006.01)
*H01L 21/8222* (2006.01)

(52) U.S. Cl. .................. 438/313; 438/204; 257/197

(58) Field of Classification Search ............ 438/204, 438/205, 313, 322, 335; 257/197, 302, 565, 257/585
See application file for complete search history.

(56) References Cited

U.S. PATENT DOCUMENTS 6,946,348 B1 * 9/2005 Zeng ..................... 438/270

OTHER PUBLICATIONS

"A New Trench Bipolar Transistor for RF Applications", Raymond J. E. Hueting et al., IEEE Transactions on Electron Devices, vol. 51, No. 7, Jul. 2004, pp. 1108-1113.

* cited by examiner

*Primary Examiner*—Phuc T. Dang
(74) *Attorney, Agent, or Firm*—Stallman & Pollock LLP

(57) ABSTRACT

A bipolar junction transistor (BJT) structure and fabrication method are provided in which a doped polysilicon filled trench is utilized to form both the extrinsic base contact region and a vertical field plate. A sacrificial mandrel of dielectric material is formed over regions that will become the BJT active area. This allows the polysilicon filled trench to be extended above the original semiconductor substrate surface. In this way, the base-collector and emitter-base junctions are both self-aligned to the field plate trench. The field plate is utilized to control and shape the electric field in the base-collector depletion region, allowing heavier collector well doping for the same breakdown voltage. This results in improvement in both the breakdown/$R_{on}$ ratio and the $f_T*BV_{cbo}$ product.

10 Claims, 3 Drawing Sheets

SUPER SELF-ALIGNED BJT WITH BASE SHORTED FIELD PLATE AND METHOD OF FABRICATING

TECHNICAL FIELD

The present invention is directed to a bipolar junction transistor (BJT) structure, and to a method of fabricating the structure, in which the base-collector and emitter-base junctions are both self-aligned to a field plate trench etch, thereby providing a super self-aligned structure.

BACKGROUND OF THE INVENTION

As discussed by Raymond J. E. Hueting et al., "A New Trench Bipolar Transistor for RF Applications", IEEE Transactions on Electron Devices, Vol. 51, No. 7, July 2004, it is well known that, for a high-voltage transistor, the tradeoff between the drift resistance and the breakdown voltage is improved by the reduced surface field (resurf) effect. The objective is to reshape the electric field distribution in the collector drift region for a reverse bias situation to form a more uniform field distribution with a reduced maximal field.

Hueting at al. propose a vertical trench SiGe junction bipolar transistor (BJT) that improves the tradeoff between the cutoff frequency $f_T$ and the off-state collector-base breakdown voltage $BV_{cbo}$. Their simulations show that an increased $f_T*BV_{cbo}$ product can be obtained by providing a BJT having a trench field plate connected to the emitter and a linearly graded doping profile in the collector drift region.

While the Hueting et al. publication provides a theoretical concept for improving the performance characteristics of a BJT device, it does not disclose a practical BJT device structure or fabrication method for realizing the concept.

Co-pending, commonly-invented and commonly-assigned U.S. application Ser. No. 11/003,095, titled "Bipolar Transistor Structure With Field Plate", and filed on the same date as this application, discloses a structure and fabrication method for realizing the Hueting et al. concept. U.S. application Ser. No. 11/003,095 is hereby incorporated by reference in its entirety.

Referring to FIG. 1, the above-cited application Ser. No. 11/003,095 discloses a bipolar junction transistor (BJT) structure 100 formed in a silicon substrate 102. An N+ collector buried layer (BL) 104, typically formed by conventional implant, is provided at the upper surface of the substrate 102. An epitaxial silicon layer 106 is formed on the substrate 102 over the N+ buried layer 104. An isolation structure that includes deep trench isolation (DTI) and shallow trench isolation (STI) is provided and an N+ sinker region 108 is formed in the epitaxial layer 106 in the conventional manner. Field plate trenches 110 are etched into the BJT active region to surround the collector active well region. The conductive field plates 112, which may be doped polysilicon or tungsten silicide, are formed in the field plate trenches 110 and isolated from the surrounding epitaxial silicon 106 of the collector well by intervening trench liner dielectric material 114 (e.g., TEOS). The field plate trenches are filled with dielectric material (e.g., TEOS). A doped polysilicon emitter contact 116 is formed in electrical contact with a SiGe intrinsic base region 118 and extrinsic base polysilicon 120. Dielectric material 122 (e.g., TEOS) separates the base poly 120 from the poly emitter contact 116.

The field plate 112 of the FIG. 1 BJT structure 100 may be separately contacted or shorted to the emitter terminal. As discussed above, the presence of the field plate 112 modifies the shape of the electric field in the collector well region. The doping level in the collector well region is graded from the collector buried layer 104 to a lower concentration at the base junction. In a properly optimized structure, the equivalent device breakdown characteristics can be realized with substantially higher net collector well doping levels. As further discussed above, this increase reduces the collector series resistance and, therefore $V_{cesat}$, and delays the onset of base pushout, resulting in a substantially higher peak $f_T$.

However, the FIG. 1 emitter shorted field plate approach requires that an alignment tolerance be observed in formation of the field plate trench structures.

SUMMARY OF THE INVENTION

The present invention provides a bipolar junction transistor (BJT) structure, and a method for fabricating the structure, in which a doped polysilicon filled trench is utilized to form both the extrinisic base contact region and a vertical field plate. A sacrificial mandrel of dielectric material is formed over regions that will become the BJT active area. This allows the poysilicon filled trench to be extended above the original semiconductor substrate surface. In this way, the base-collector and emitter-base junctions are both self-aligned to the field plate trench etch. The field plate is utilized to control and shape the electric field in the base-collector depletion region, allowing heavier collector well doping for the same breakdown voltage. This results in improvement in both the breakdown/$R_{on}$ ratio and the $f_T*BV_{cbo}$ product.

The features and advantages of the present invention will be more fully appreciated upon consideration of the following detailed description of the invention and the accompanying drawings that set forth an illustrative embodiment in which the principles of the invention are utilized.

DESCRIPTION OF THE INVENTION

A super self-aligned bipolar junction transistor (BJT) structure, and a method of fabricating the structure, in accordance with the concepts of the invention, will now be described with reference to FIGS. 2A–2D. Specifics of the BJT structure and of the fabrication method, such as, for example device feature size, material layer thickness and dopant concentrations, are not provided, since, as will be appreciated by those skilled in the art, these parameters will vary depending upon the device application and are not germane to the concepts of the invention.

Figure 2A:
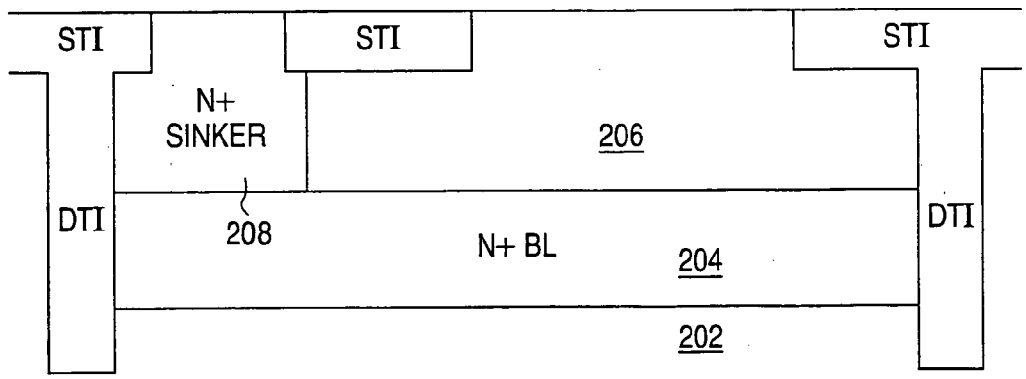
FIGS. 2A–2D are partial cross-section drawings illustrating a sequence of steps for fabricating a super self-aligned bipolar junction transistor in accordance with the present invention.

FIG. 2A shows a well-known "starting" structure for a bipolar junction transistor to be formed in a substrate 202 of crystalline silicon. The FIG. 2A structure includes an N+ buried layer (BL) 204 that serves as the BJT collector region formed on the upper surface of the silicon substrate 202. A layer 206 of collector epitaxial silicon is formed on the N+ buried layer 204; preferably, the doping level in the epitaxial layer 206 is graded from a higher concentration at the buried layer 204 to a lower concentration at its upper surface. An isolation structure that includes deep trench isolation (DTI) and shallow trench isolation (STI) is provided and an N+ sinker region 208 is formed in the epitaxial layer 206, all in the conventional manner.

Figure 2B:
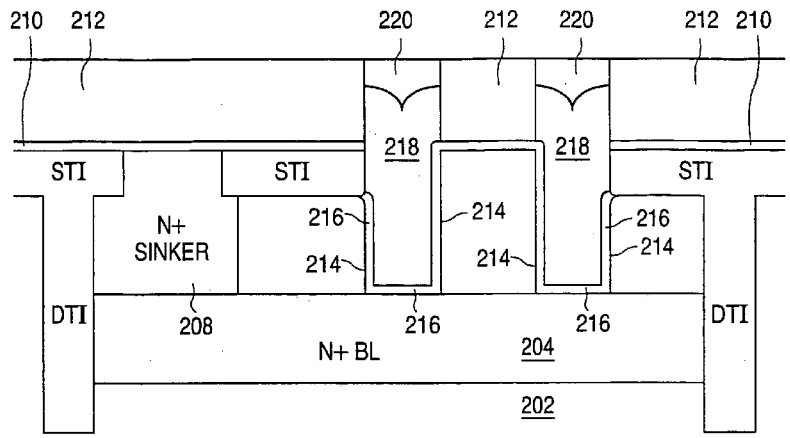

Referring to FIG. 2B, a layer of pad silicon oxide 210 is then formed on the surface of the FIG. 2A structure, followed by deposition of a silicon nitride layer 212, preferably about 0.5 μm thick (the thickness of the silicon nitride layer 212 should be sufficient to provide a margin for reliable over etch of the trench poly fill to obtain a required recess of about 0.3 μm of poly height above the silicon surface to form a reliable contact to the intrinsic base, as discussed in greater detail below). A photoresist field plate trench patterned mask (not shown) is then formed on the nitride layer 212 and utilized to perform an etch trough the nitride 212 and the pad oxide 210 and into the epitaxial layer 206 to form a field plate trench that extends to the N+ buried layer 204 (the sidewalls of the plate field plate trench are designated by the numeral "214" in FIG. 2B. Next, field plate trench liner oxide 216 is formed on the exposed surfaces of the field plate trench 214, for example, by thermal oxidation or by chemical vapor deposition using, for example tetraorthosilicate (TEOS); those skilled in the art will appreciate that the similar results could be obtained with LPCVD or PECVD oxide using Silane or another conventional source. The oxide lined field plate trench is then filled with P-doped polysilicon 218, which is then etched back to remove the polysilicon from the nitride layer 212 and to etch the poly 218 back in the trench area to be below the upper surface of the nitride layer 212. A TEOS deposition step is then performed and the resulting oxide is chemically mechanically polished to the surface of the nitride layer 212, leaving oxide mandrels 220 on the field plate trench polysilicon 218.

Figure 2C:
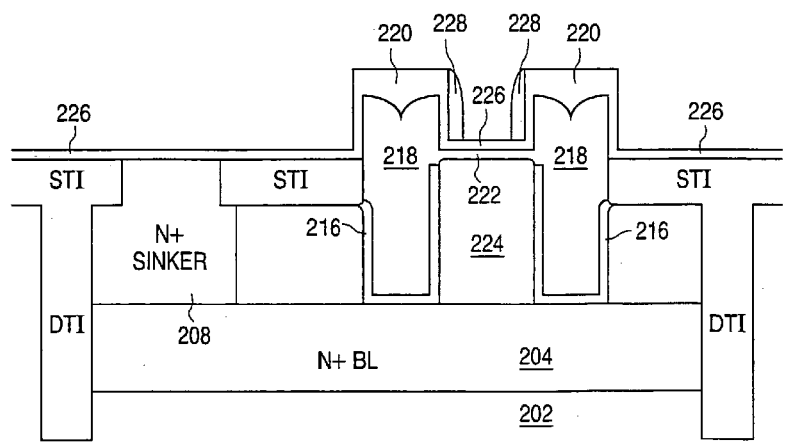

Referring to FIG. 2C, the nitride layer 212 is then stripped and a short HF dip step is performed to remove the pad oxide 210. A silicon/germanium (SiGe) epitaxial layer 222 is formed by selective epitaxial growth (SEG) on the upper surface of the graded-profile collector active region well 224 defined by the surrounding field plate trench to provide the intrinsic base region of the BJT device structure. As shown in FIG. 2C, the SiGe layer 222 contacts the trench poly 218 such that the trench poly 218 provides both the extrinsic base contact region for the BJT structure as well as the field plate. Following formation of the SiGe base epi 222, a TEOS deposition step is performed to provide spacer oxide 226. A layer of polysilicon is then deposited and anisotropically etched to provide polysilicon spacers 228 on the sidewalls of the self-aligned emitter contact opening.

Figure 2D:
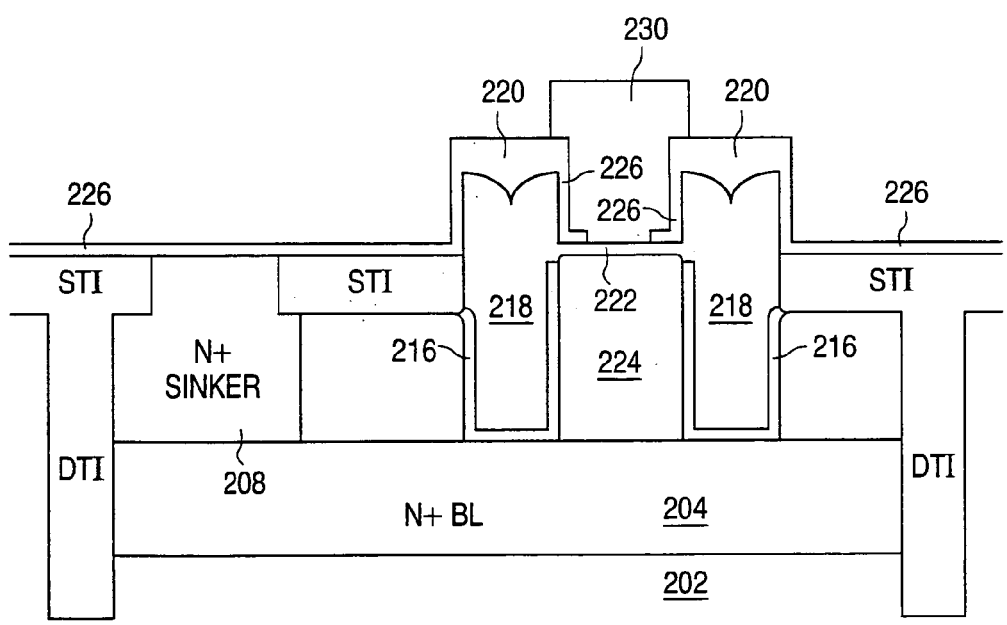

As shown in FIG. 2D, a short HF dip is then performed to remove the exposed TEOS spacer material in the emitter contact opening, thereby exposing the SiGe intrinsic base layer 222. A layer of N-doped emitter polysilicon is then deposited and annealed to drive N-type dopant from the poly into the underlying SiGe layer 222 to provide an emitter contact region (not shown) in the SiGe intrinsic base 222. The emitter poly is then patterned to define the BJT poly emitter contact 230.

The BJT device structure is then completed in accordance with integrated circuit fabrication techniques well know to those skilled in the art.

Figure 1:
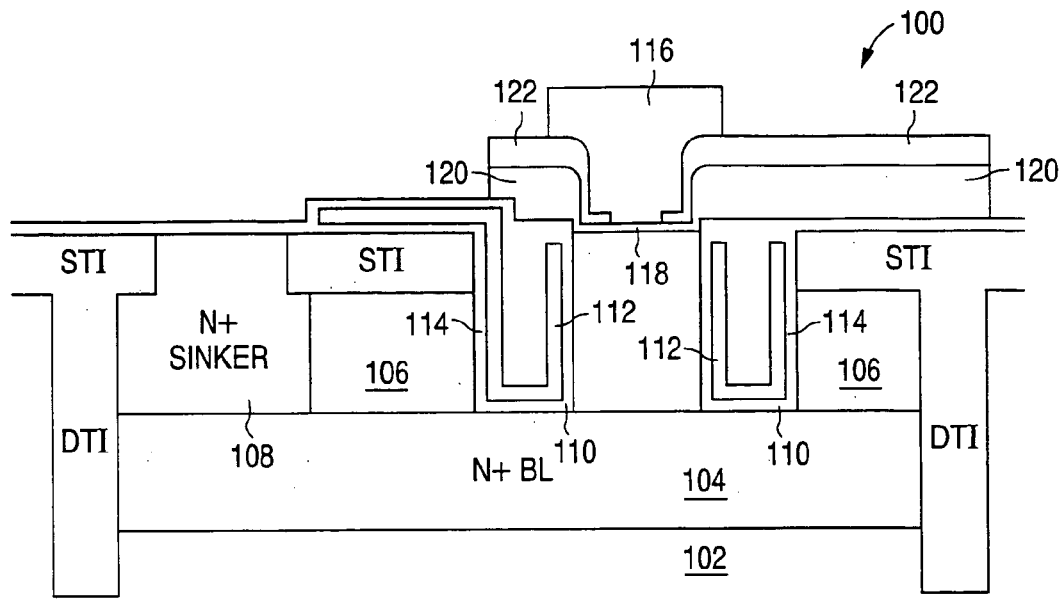
FIG. 1 is a partial cross-section drawing illustrating a bipolar junction transistor structure with a vertical field plate.

Thus, in accordance with the concepts of the invention described above, the base-collector and emitter-base junctions of the BJT device are both self-aligned to the field plate trench etch to provide a super self-aligned structure. As discussed above, the field plate is used to control and shape the electric field in the base-collector depletion region, allowing heavier collector doping for the same breakdown voltage, In this way, the breakdown/$R_{on}$ ration and the $f_T*BV_{cbo}$ product are improved. (It is noted that the BJT structure shown in FIG. 1 does not have the self-aligned advantages of the FIG. 2D structure, the FIG. 1 structure is incrementally better for controlling base-collector breakdown.)

It should be understood that the particular embodiments of the invention described above have been provided by way of example and that other modifications may occur to those skilled in the art without departing from the scope and spirit of the invention as expressed in the appended claims and their equivalents.

What is claimed is:

1. A bipolar junction transistor (BJT) structure that includes a self-aligned emitter contact, and wherein the BJT structure includes an N+ collector buried layer formed at an upper surface of a semiconductor substrate, an N-type collector epitaxial layer formed on the buried layer, a dielectric isolation structure that extends from the upper surface of the epitaxial layer to the buried layer to define a BJT active device region and an N+ sinker diffusion region formed in the BJT active device region to extend from the upper surface of the epitaxial layer to the buried layer, the BJT structure further comprising:

a field plate trench formed in the BJT active device region to surround a collector well region of the epitaxial layer and extending from the upper surface of the epitaxial layer to the buried layer;

field plate polysilicon formed in the field plate trench and separated from the epitaxial layer and the buried layer by intervening dielectric material, the field plate polysilicon extending above the upper surface of the epitaxial layer;

P-type base conductive material formed on the upper surface of the collector well region, the P-type base conductive material being formed to be in contact with the field plate polysilicon; and an N-type conductive emitter formed to be in contact with the base conductive material, the emitter being separated from the field plate polysilicon by intervening dielectric material.

2. A BJT structure as in claim 1, and wherein the collector well region comprises N-type dopant having a graded doping profile.

3. A BJT structure as in claim 1, and wherein the semiconductor substrate comprises crystalline silicon.

4. A BJT structure as in claim 1, and wherein base conductive material comprises SiGe.

5. A BJT structure as in claim 1, and wherein the conductive emitter comprises N-doped polysilicon.

6. A method of forming a bipolar junction transistor (BJT) structure that includes a self-aligned emitter contact, and wherein the BJT structure includes an N+ collector buried layer formed at an upper surface of a semiconductor substrate, an N-type collector epitaxial layer formed on the buried layer, a dielectric isolation structure that extends from the upper surface of the epitaxial layer to the buried layer to define a BJT active device region and an N+ sinker diffusion region formed in the BJT active device region to extend from the upper surface of the epitaxial layer to the buried layer, the method comprising;

forming a field plate trench in the epitaxial layer of the active device region to surround a collector well region of the epitaxial layer and extending from the upper surface of the epitaxial layer to the buried layer;

forming liner dielectric material in exposed surfaces of the field plate trench;

forming field plate polysilicon in the lined field plate trench such that the field plate polysilicon is separated from the epitaxial layer and the buried layer by the liner dielectric material, the field plate polysilicon being formed to extend above the upper surface of the epitaxial layer;

forming P-type base conductive material on the upper surface of the collector well region, the base conductive material being formed to be in contact with the field plate polysilicon; and forming an N-type conductive emitter to be in contact with the base conductive material, the emitter being separated from the field plate polysilicon by intervening dielectric material.

7. A method as in claim 6, and wherein the collector well region is formed to include N-type dopant having a graded doping profile.

8. A method as in claim 6, and wherein the semiconductor substrate comprises crystalline silicon.

9. A method as in claim 6, and wherein the base conductive material comprises SiGe.

10. A method as in claim 1, and wherein the emitter comprises N-doped polysilicon.

* * * * *